(12) United States Patent
Yoshimura et al.

(10) Patent No.: US 8,119,923 B2
(45) Date of Patent: Feb. 21, 2012

(54) CIRCUIT BOARD

(75) Inventors: Hideaki Yoshimura, Kawasaki (JP);
Kenji Fukuzono, Kawasaki (JP); Kenji Iida, Kawasaki (JP); Tomoyuki Abe, Kawasaki (JP); Yasutomo Maehara, Kawasaki (JP); Takashi Nakagawa, Kawasaki (JP); Shin Hirano, Kawasaki (JP); Takashi Kanda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 758 days.

(21) Appl. No.: 12/188,257

(22) Filed: Aug. 8, 2008

(65) Prior Publication Data

US 2009/0084590 A1     Apr. 2, 2009

(30) Foreign Application Priority Data

Sep. 28, 2007   (JP) ................................. 2007-254891

(51) Int. Cl.
   *H05K 1/00*    (2006.01)
   *B32B 9/00*    (2006.01)
(52) U.S. Cl. ..................... 174/258; 428/209; 428/210
(58) Field of Classification Search ............... None
   See application file for complete search history.

(56) References Cited

U.S. PATENT DOCUMENTS

| 4,849,858 A * | 7/1989 | Grapes et al. ............... 361/708 |
| 4,963,414 A * | 10/1990 | LeVasseur et al. .......... 428/195.1 |
| 5,153,077 A * | 10/1992 | Kashiba et al. .............. 428/627 |
| 5,195,021 A * | 3/1993 | Ozmat et al. ................. 361/720 |
| 5,403,651 A * | 4/1995 | Miyagi ........................ 428/209 |
| 5,949,650 A * | 9/1999 | Bulante et al. ............... 361/704 |
| 6,340,796 B1 * | 1/2002 | Smith et al. ................... 174/255 |
| 6,438,281 B1 | 8/2002 | Tsukamoto et al. |
| 6,869,665 B2 | 3/2005 | Tani et al. |
| 7,266,888 B2 * | 9/2007 | Chang et al. .................. 29/846 |
| 2005/0145413 A1 * | 7/2005 | Chang et al. ................ 174/250 |
| 2007/0007250 A1 | 1/2007 | Li |

FOREIGN PATENT DOCUMENTS

| JP | 6-244552 | 9/1994 |
| JP | 8-333157 | 12/1996 |
| JP | 2002-217537 | 8/2002 |
| JP | 2003-124410 | 4/2003 |
| JP | 2004-119691 | 4/2004 |
| JP | 2007-103605 | 4/2007 |
| KR | 10-0280298 | 2/2001 |
| KR | 10-0512801 | 9/2005 |
| KR | 10-2007-006597 | 1/2007 |

(Continued)

OTHER PUBLICATIONS

Korean Office Action issued on Jul. 29, 2010 in Korean Patent Application 10-2008-0080957.
Communication issued by the Taiwan Patent Office on Aug. 19, 2011 in the corresponding Taiwanese patent application.

(Continued)

*Primary Examiner* — Gregory Thompson
(74) *Attorney, Agent, or Firm* — Staas & Halsey LLP

(57) ABSTRACT

A circuit board has a low thermal expansion coefficient that suits the thermal expansion coefficient of an element to be mounted thereupon and can prevent the occurrence of delamination and cracking of a core layer when the circuit board is used in a low temperature environment. The circuit board is constructed by laminating a core layer and at least one wiring layer, where the at least one wiring layer has slightly smaller external dimensions in a planar direction than the core layer.

4 Claims, 7 Drawing Sheets

FOREIGN PATENT DOCUMENTS

| | | |
|---|---|---|
| KR | 10-0765819 | 10/2007 |
| TW | I246369 | 12/2005 |
| WO | 97/19579 | 5/1997 |
| WO | 02/071824 A1 | 9/2002 |

OTHER PUBLICATIONS

Office Action mailed from the Japanese Patent Office on Dec. 20, 2011 in the corresponding Japanese patent application.

* cited by examiner

CIRCUIT BOARD

BACKGROUND OF THE INVENTION

1. Field of the Invention

The present invention relates to a circuit board and in more detail to a circuit board with a multilayer structure constructed by laminating a core layer and one or more wiring layers.

2. Related Art

In recent years, in response to demand for improved performance and miniaturization of electronic appliances, there have been rapid increases in the packing density of electronic components in electronic appliances. As the packing density has increased, it has become common for semiconductor chips to be surface-mounted on circuit boards as bare chips, a process called "flip-chip mounting".

However, when flip-chip mounting is carried out, although the thermal expansion coefficient in the planar direction for a semiconductor chip produced using a typical semiconductor material is around 3.5 ppm/° C., the thermal expansion coefficient in the planar direction for a typical circuit board that uses a glass epoxy substrate as a core substrate is 12 to 20 ppm/° C., resulting in a relatively large difference in thermal expansion coefficients. This means that changes in environmental temperature and the like are likely to produce stress at the electrical connections between the circuit board and the semiconductor chip. The production of such stress can cause cracking or delamination at the connections.

As one method of eliminating or reducing the above problem due to the difference in thermal expansion coefficients in the planar direction between the circuit board and the semiconductor chip, it would be conceivable to use a circuit board with a low thermal expansion coefficient.

One example of a conventional circuit board with a reduced thermal expansion coefficient is the circuit board 100 disclosed in Patent Document 1. As shown in the detailed cross-sectional view in FIG. 5, the plan view in FIG. 6A and the schematic cross-sectional view in FIG. 6B, the circuit board 100 includes a core layer 110 composed of a carbon fiber material 111a and a resin composite 111b that includes an inorganic filler, laminated wiring portions 120 that each include insulating layers 121 formed on the core layer 110 and wiring patterns 122 provided on the insulating layers 121, and conductive portions 130 that extend in the thickness direction inside the core layer 110 and electrically connect the wiring patterns 122 of the laminated wiring portions 120. By using this construction, it is possible to sufficiently reduce the thermal expansion coefficient in the planar direction of the circuit board.

Patent Document 1
Japanese Laid-Open Patent Publication No. 2004-119691

SUMMARY OF THE INVENTION

However, the composite material composed of the carbon fiber material and resin composite used as the core layer 110 described above is weak in compression, and in particular when the circuit board is cooled from the laminating temperature to a low temperature, as shown in FIG. 7, there is the problem of delamination and cracks 140 occurring at the substrate part of the core layer 110.

The present invention was conceived in view of the situation described above and it is an object of the present invention to provide a circuit board that has a low thermal expansion coefficient that is suited to the thermal expansion coefficient of the elements to be mounted and can also prevent delamination of the core layer and the production of cracks when used in a low temperature environment.

To achieve the stated object, a circuit board according to the present invention is constructed by laminating a core layer and at least one wiring layer, wherein the at least one wiring layer has slightly smaller external dimensions in a planar direction than the core layer.

According to the above construction, it is possible to reduce the tensile stress produced at corner portion side surfaces and edge center portion side surfaces of the circuit board, and by doing so, it is possible to prevent the occurrence of delamination and cracking in the core layer and thereby improve the lifespan of the circuit board.

The core layer may be composed of a resin composite including a carbon fiber material.

According to the above construction, by including a core layer composed of a resin composite including a carbon fiber material, it is possible to provide a circuit board with the desired low thermal expansion coefficient.

Also, a thermal expansion coefficient in a planar direction of the circuit board in a laminated state may be no greater than 15 ppm/° C.

According to the above construction, even if the core layer is formed of a material aside from a material that includes carbon fiber material, so long as the thermal expansion coefficient in the planar direction of the circuit board is no greater than 15 ppm/° C., it will still be possible to reduce the thermal expansion coefficient and to increase the lifespan.

The at least one wiring layer may include a first wiring layer and a second wiring layer, where the first wiring layer is laminated on a front surface of the core layer, and the second wiring layer is laminated on a rear surface of the core layer.

According to the above construction, in a circuit board where a first wiring layer is laminated on a front surface of the core layer and a second wiring layer is laminated on a rear surface of the core layer in particular, it is possible to reduce the tensile stress produced at corner portion side surfaces and edge center portion side surfaces.

Also, an outer edge portion of the at least one wiring layer and an outer edge portion of the core layer may be separated by at least 1 mm in the planar direction.

According to the above construction, since the rate of change in the value of the tensile stress is large when the separation distance is below 1 mm, a construction where the separation distance is at least 1 mm is preferable in achieving a large reduction in tensile stress.

DESCRIPTION OF THE PREFERRED EMBODIMENTS

Figure 1A:
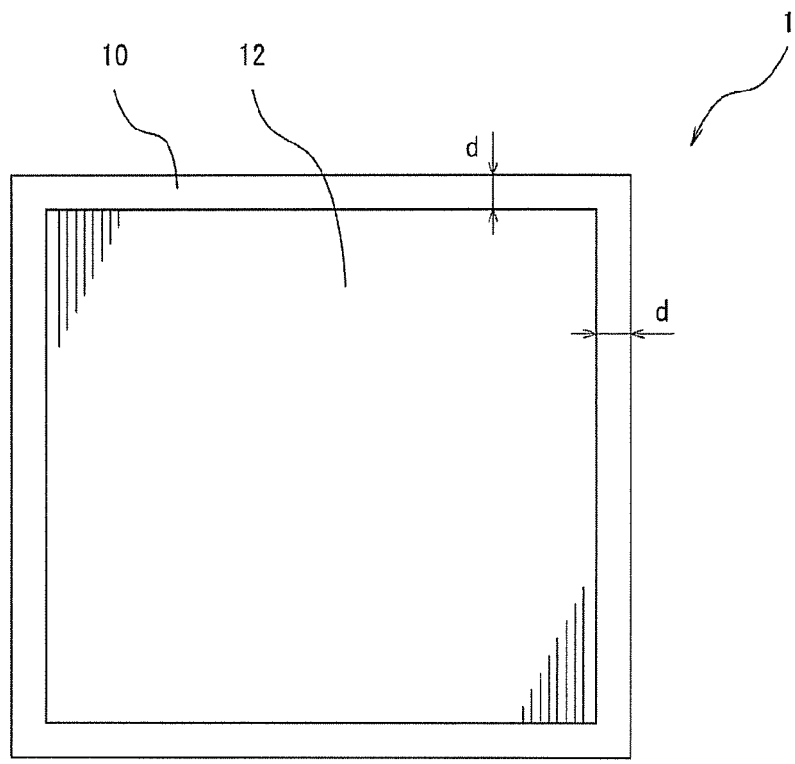
FIGS. 1A and 1B are schematic diagrams showing examples of circuit boards according to an embodiment of the present invention.
Figure 1B:
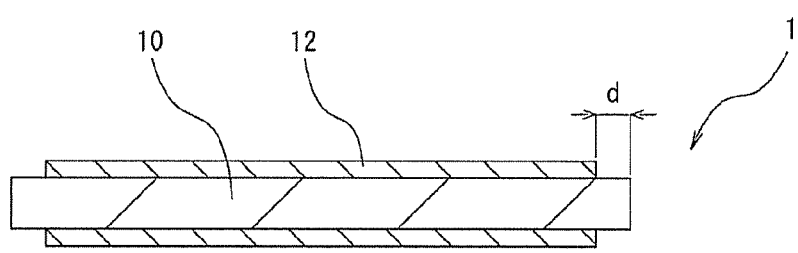
Figure 2:
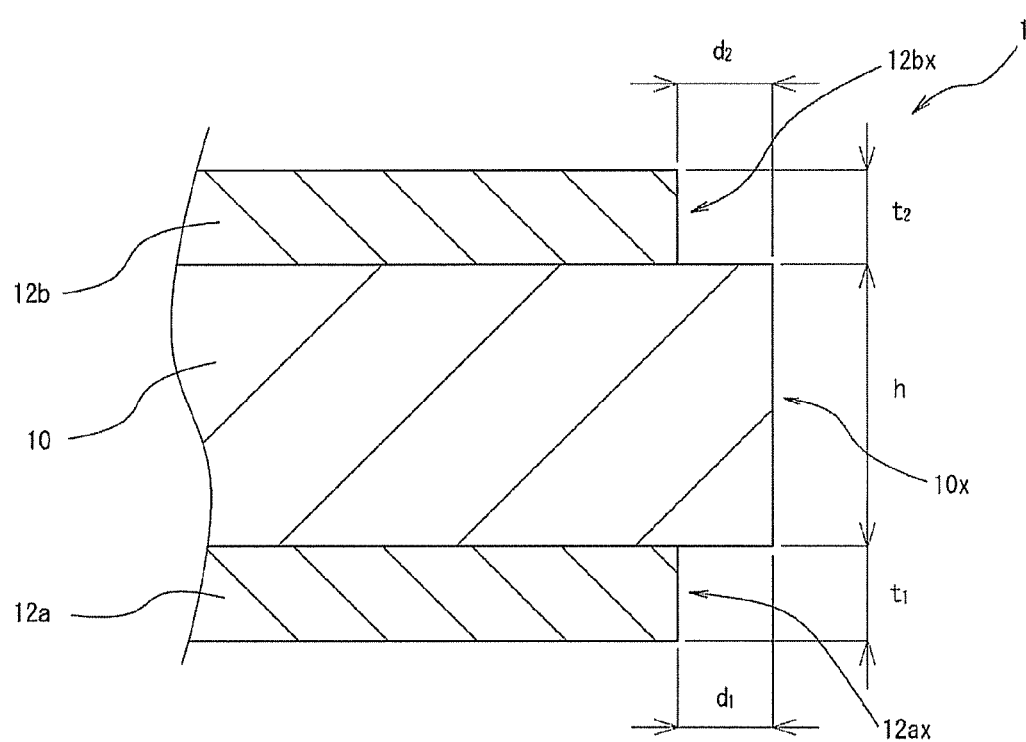
FIG. 2 is an enlarged view of a corner portion of the circuit board shown in FIGS. 1A and 1B.

Preferred embodiments of the present invention will now be described in detail with reference to the attached drawings. FIG. 1A and FIG. 1B are schematic diagrams showing one example of a circuit board 1 according to an embodiment of the present invention. FIG. 2 is an enlarged view of a corner portion of the circuit board 1. FIGS. 3A and 3B and FIGS. 4A and 4B show simulation results of tensile stress produced at corner portion side surfaces and edge center portion side surfaces of the circuit board. Note that regarding the reference numerals used in the drawings, the numeral 12 is used to collectively represent the numerals 12a, 12b. This is also the case for other numerals.

First, FIGS. 1A and 1B show the circuit board 1 according to an embodiment of the present invention. FIG. 1A is a plan view of the circuit board 1 and FIG. 1B is a front view of the circuit board 1 (in cross section). The circuit board 1 includes a core layer 10 and a pair of wiring layers 12 (indicated as 12a, 12b in the drawings). The wiring layer 12a and the wiring layer 12b are laminated on the front surface and rear surface respectively of the core layer 10. Note that although the circuit board 1 is normally provided with plated throughholes or via holes that pass through the thickness direction to electrically connect the pair of wiring layers 12, such elements are omitted from the drawings.

In the present embodiment, the core layer 10 is constructed using a resin composite that includes a carbon fiber material. As one example, the core layer 10 is formed by machining a sheet of carbon fiber reinforced plastic (CFRP) composed of a carbon fiber material and a resin composite that is hardened with the carbon fiber material encapsulated therein.

The carbon fiber material is carbon fiber cloth which is woven from carbon fiber threads produced by bundling carbon fibers, and in the present embodiment, the cloth is oriented so as to extend in the planar direction of the core layer 10. Note that in place of carbon fiber cloth, it is possible to use carbon fiber mesh or nonwoven carbon fiber. Also, in the present embodiment, the amount of carbon fiber material included in the core layer 10 is 30 to 80 vol %.

The resin composite includes a resin part and inorganic filler that is dispersed in the resin part. Here, polysulfone, polyethersulfone, polyphenylsulfone, polyphthalamide, polyamide imide, polyketone, polyacetal, polyimide, polycarbonate, degenerated polyphenylene ether, polyphenylene oxide, polybutylene terephthalate, polyacrylate, polysulfone, polyphenylene sulfide, polyetheretherketone, tetrafluoroethylene, epoxy, cyanate ester, and bismaleimide can be given as examples of the resin part. Silica powder, alumina powder, magnesium hydroxide powder, aluminum nitride powder, and aluminum hydroxide powder can be given as examples of the inorganic filler. In the present embodiment, the weight average particle size of the inorganic filler is 10 μm or below and the included amount of an inorganic filler in the resin composite is 5 to 50 wt %.

In the present embodiment, the thermal expansion coefficient in the planar direction of the core layer 10 included in the construction described above is around 0 to 17 ppm/° C. Note that when the circuit board 1 according to the present invention is used as a chip mounting board of an LGA package, a motherboard, or the like, the thermal expansion coefficient of the core layer 10 should preferably be set at 0 to 6 ppm/° C. Also, when the circuit board 1 according to the present invention is used as a chip mounting board of a BGA package or the like, the thermal expansion coefficient of the core layer 10 should preferably be set at 3 to 17 ppm/° C.

On the other hand, the wiring layers 12 are structures where wiring is provided on multiple layers by a so-called "buildup" method, and although not shown, have a typical laminated structure composed of insulating layers and wiring patterns. Each insulating layer is composed of the same material as the resin composite used in the core layer 10 described above. Each wiring pattern is constructed of copper, for example. Note that the wiring patterns formed on adjacent layers are electrically connected to one another by via holes. Also, electrode pads used as external connections are formed in the uppermost wiring pattern.

Here, as the characteristic structure of the present invention, the wiring layers 12 on the circuit board 1 are formed with slightly smaller external dimensions in the planar direction than the core layer 10. Here, there are no limitations on the method used to machine the layers, and as one example it is possible to use end milling.

For the circuit board 1 with the construction described above, simulation results for the tensile stress that is produced at a corner portion side surface and an edge center portion side surface of the circuit board 1 are shown in FIGS. 3A and 3B and FIGS. 4A and 4B for a case where the separation distance in the planar direction between an outer edge portion 12x of the wiring layers 12 and an outer edge portion 10x of the core layer 10 is expressed as d.

Figure 3A:
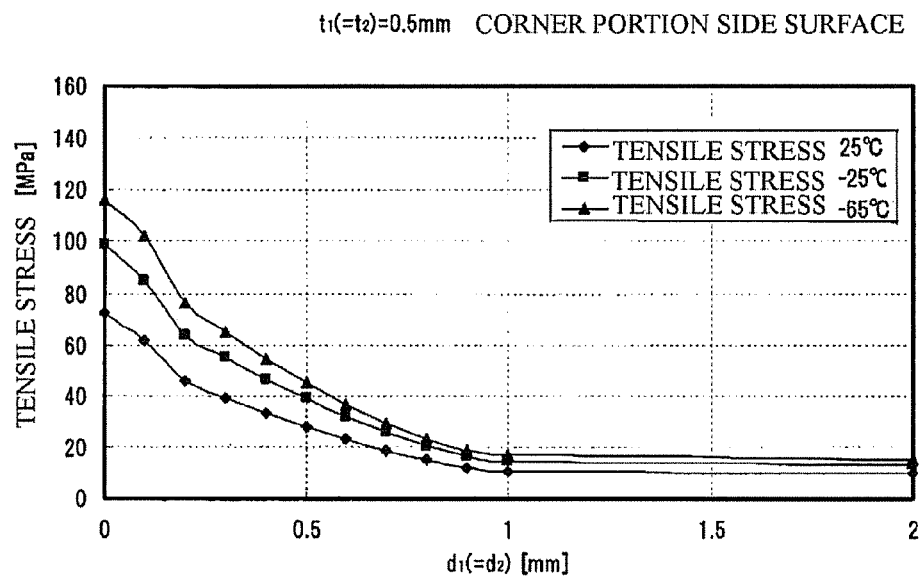
FIGS. 3A and 3B show simulation results of tensile stress that is produced at a corner portion side surface and an edge center portion side surface of the circuit board shown in FIGS. 1A and 1B.
Figure 3B:
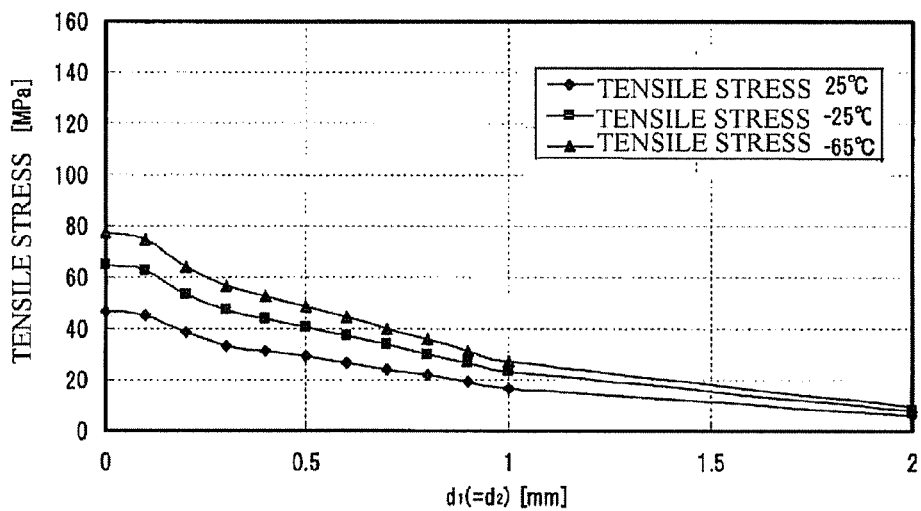

In FIGS. 3A and 3B, the thickness $t_1$ of the first wiring layer 12a is set so that $t_1$=0.5 mm, the thickness $t_2$ of the second wiring layer 12b is set so that $t_2$=0.5 mm, and the thickness h of the core layer 10 is set so that h=3 mm. Note that the wiring layers in the present embodiment are constructed by laminating six layers that are each composed of an insulating layer and a wiring pattern, and providing bonding sheets with a thickness of 0.05 mm between the core layer 10 and the wiring layers 12. Note that the bonding sheets may be regarded as part of the wiring layers 12.

Here, the tensile stress when the separation distance $d_1$ in the planar direction between the outer edge portion 12ax of the first wiring layer 12a and the outer edge portion 10x of the core layer 10 is varied are shown in FIG. 3A and FIG. 3B at a corner portion side surface and an edge center portion side surface of the circuit board 1, respectively. Here, when the separation distance in the planar direction between an outer edge portion 12bx of the second wiring layer 12b and the outer edge portion 10x of the core layer 10 is expressed as $d_2$, the examples in FIG. 3A show the case where $d_2=d_1$.

Figure 4A:
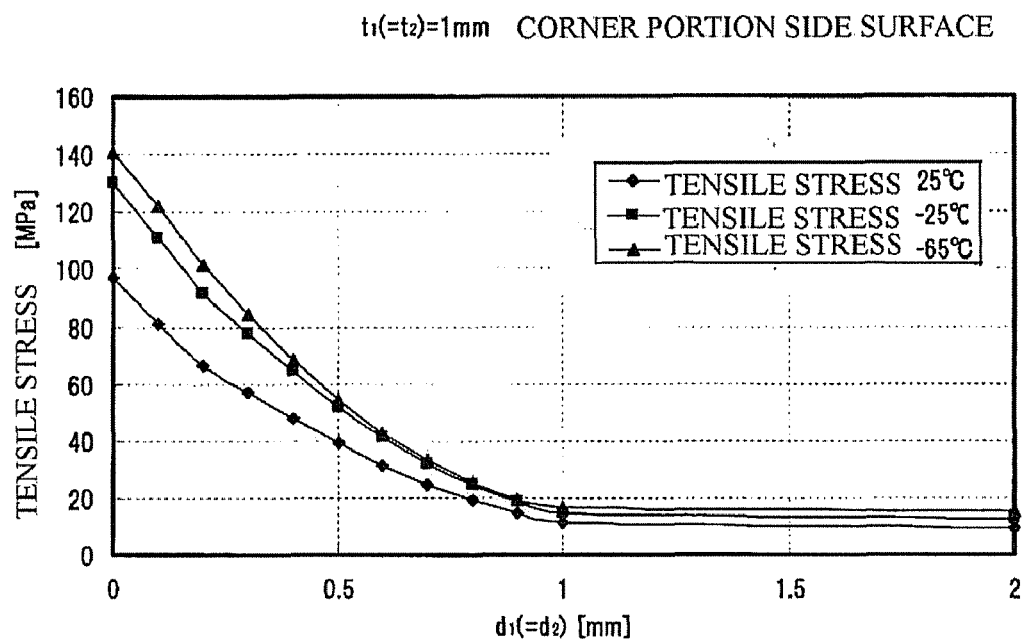
FIGS. 4A and 4B show simulation results of tensile stress that is produced at a corner portion side surface and an edge center portion side surface of the circuit board shown in FIGS. 1A and 1B.
Figure 4B:
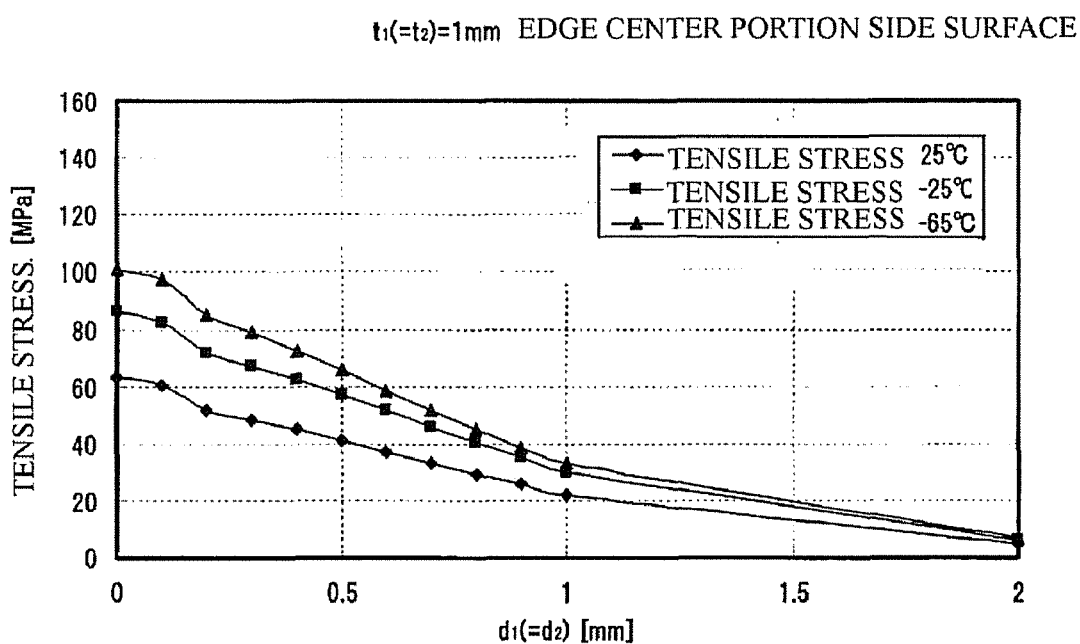
Figure 5:
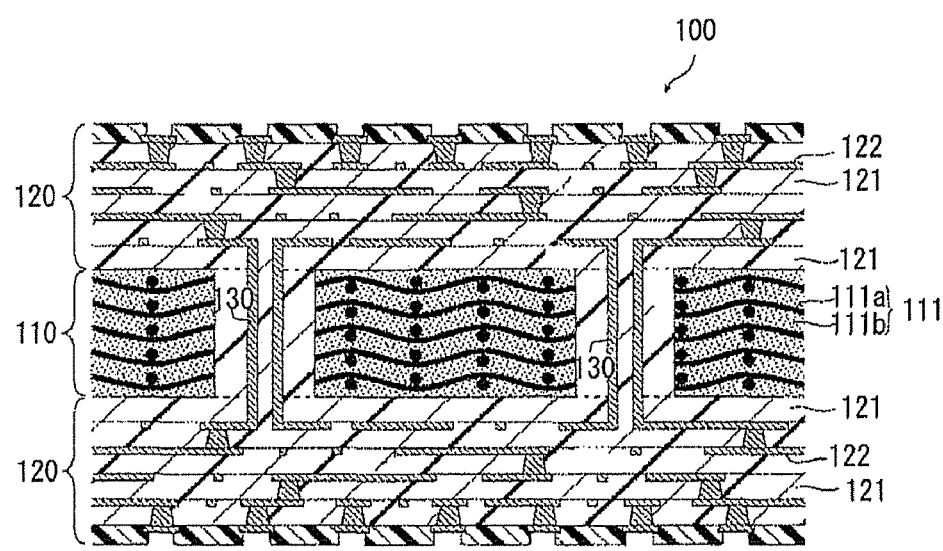
FIG. 5 is a schematic diagram showing one example of a circuit board according to the conventional art.

On the other hand, in FIGS. 4A and 4B, the thickness $t_1$ of the first wiring layer 12a is set so that $t_1$=1 mm, the thickness $t_2$ of the second wiring layer 12b is set so that $t_2$=1 mm, and the thickness h of the core layer 10 is set so that h=3 mm. Note that the wiring layers in the present embodiment are constructed by laminating six layers that are each composed of insulating layers and wiring patterns and providing a bonding sheet with a thickness of 0.05 mm between the core layer 10 and the wiring layers 12. Note that the bonding sheets may be regarded as part of the wiring layers 12.

Here, the tensile stress when the separation distance $d_1$ in the planar direction between the outer edge portion 12ax of the first wiring layer 12a and the outer edge portion 10x of the core layer 10 is varied are shown in FIG. 4A and FIG. 4B at a corner portion side surface and an edge center portion side surface of the circuit board 1, respectively. In this example also, $d_2=d_1$.

As should be clear from the data shown in FIGS. 3A and 3B and FIGS. 4A and 4B, if the separation distance d in the planar direction between an outer edge portion 12x of a wiring layer 12 and the outer edge portion 10x of the core layer 10 is a value that is above zero, there is an effect whereby the tensile stress produced at a corner portion side surface and at an edge center portion side surface of the circuit board 1 is reduced compared to the case where d=0. As a result of carrying out a greater number of simulations aside from the models shown in FIGS. 3A and 3B and FIGS. 4A and 4B and carrying out analysis for the case where the values of t, h, and the package size were varied, it was confirmed that the rate of change in the value of the tensile stress tends to be large when d is below 1 mm and to be low when d is above 1 mm, with d=1 mm as a boundary. Accordingly, it is believed that using a construction where the separation distances $d_1$, $d_2$ in the planar direction between the outer edge portions 12ax and 12bx of the wiring layers 12a, 12b and the outer edge portion 10x of the core layer 10 are set at least 1 mm is favorable in achieving a larger reduction in the tensile stress. However, even if $d_1$ and $d_2$ are lengths that are below 1 mm, although the reduction is smaller, it will still be possible to achieve the same effect as described above. Note that from the viewpoint of preventing warping of the circuit board 1, it is favorable to set $d_1$ and $d_2$ at the same length.

In addition to the simulation described above, circuit boards with two sizes where the external dimensions in the planar direction are 70 by 135 mm and 54 by 54 mm were actually fabricated, temperature cycle tests were carried out, and checks were carried out for delamination and cracking. Note that as the method of carrying out the temperature cycle tests, cycles were repeated where the circuit board was cooled for twenty minutes at −65° C. and then heated for twenty minutes at 125° C.

Figure 6A:
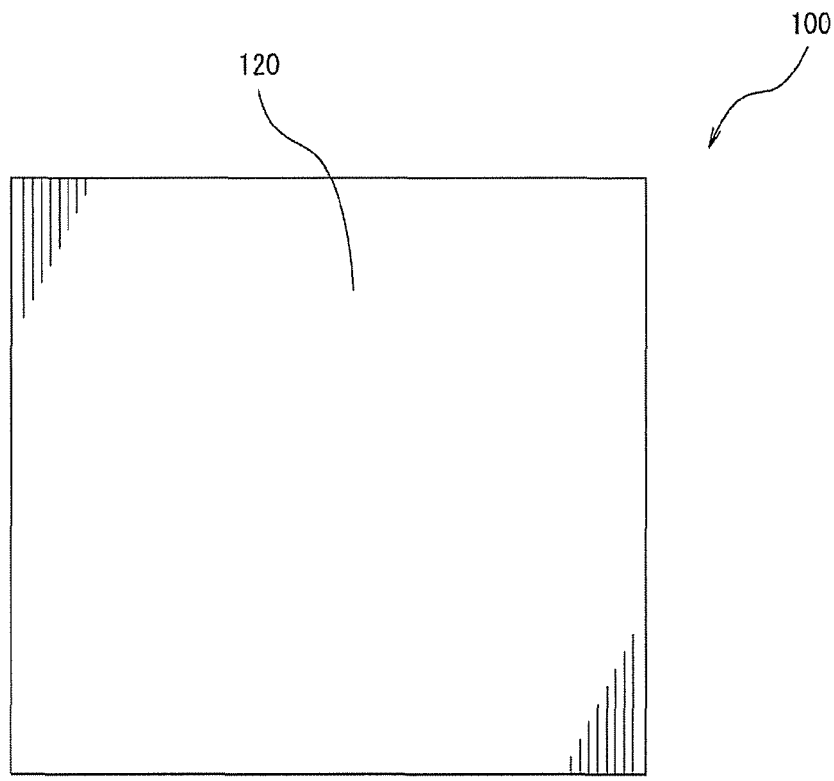
FIGS. 6A and 6B are schematic diagrams showing examples of a circuit board according to the conventional art.
Figure 6B:
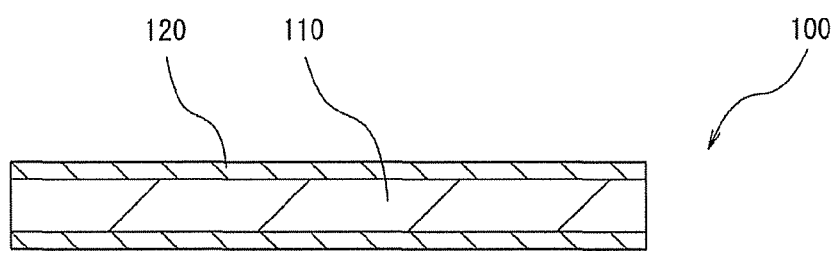
Figure 7:
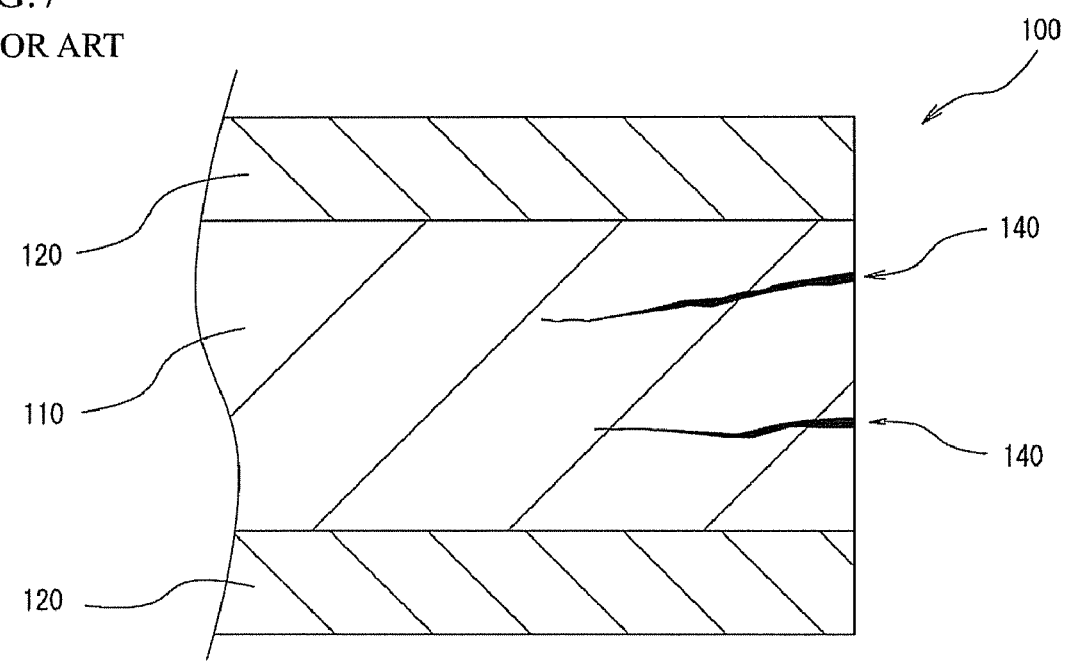
FIG. 7 is an enlarged view of a corner portion of the circuit board according to the conventional art (a view of a state where cracking has occurred).

As a result, it was confirmed that although cracking occurred in the conventional circuit board (where d=0) (see FIGS. 6A and 6B) within ten of the repeated cycles described above, delamination and cracking did not occur for the circuit board (where d=1 mm) according to the present embodiment (see FIGS. 1A and 1B) until five hundred of the repeated cycles described above were carried out, thereby indicating a remarkable increase in lifespan. The experiment results are shown below in Table 1.

TABLE 1

| Tested Sample | No. of Cycles | | | | | |
| --- | --- | --- | --- | --- | --- | --- |
| | 10 | 30 | 50 | 100 | 250 | 500 |
| Conventional Circuit Board (separation distance: d = 0 mm) | X | — | — | — | — | — |
| Circuit Board of Present Embodiment (separation distance: d = 1 mm) | ○ | ○ | ○ | ○ | ○ | ○ | where ○: No cracks X: Cracks present

These experiment results clearly show that in the simulations described above, the circuit board according to the present embodiment has an effect whereby tensile stress is reduced. As a result of such reduction in tensile stress, there is an increase in the number of repeated tests until cracking occurs in the temperature cycle tests, that is, it was demonstrated that there is an increase in lifespan.

As described above, according to the circuit board 1 according to the present embodiment, by increasing the core layer composed of a resin composite including a carbon fiber material, it is possible to provide a circuit board with the desired low thermal expansion coefficient. The thermal expansion coefficient in the planar direction of the entire circuit board 1 is heavily dependent on the thermal expansion coefficient of the core layer 10, and since the core layer 10 of the circuit board 1 internally includes the carbon fiber material that extends in the planar direction, it is possible to reduce the thermal expansion coefficient of the core layer 10 in the planar direction.

In addition, by providing the wiring layers 12 with somewhat smaller external dimensions in the planar direction than the core layer 10, it is possible to reduce the tensile stress at the corner portion side surfaces and edge center portion side surfaces of the circuit board 1 in an environment where the circuit board is cooled from the laminating temperature to a low temperature. By doing so, it is possible to prevent the occurrence of delamination and cracking in the core layer 10 and to greatly increase the lifespan of a circuit board compared to a conventional circuit board.

Note that as another example of the core layer, a construction that uses a material that does not include carbon fiber material like that described above is also conceivable. That is, although a heat-resistant material such as FR4 or the like typically used as a conventional core layer has a thermal expansion coefficient of around 15 ppm/° C. or above, if a circuit board has a core layer made of a material aside from materials that include carbon fiber material and the thermal expansion coefficient of the entire circuit board in the planar direction is 15 ppm/° C. or below, a low thermal expansion coefficient will still be achieved. In a circuit board provided with such a core layer, if the external dimensions in the planar direction of the wiring layers are slightly smaller than the core layer, the same effect as described above can be obtained. That is, it is possible to obtain a circuit board with a low thermal expansion coefficient and an increased lifespan.

As described above, according to the circuit board according to the present invention, it is possible to reduce the thermal expansion coefficient of a circuit board to a desired value. With a circuit board with such low thermal expansion coefficient, there is little difference in thermal expansion coefficients between the circuit board and the elements to be mounted thereupon, and therefore in a state where such elements are mounted, it will be possible to prevent a fall in the reliability of the connections between the circuit board and the elements due to a difference in thermal expansion coefficients. In addition, it is possible to reduce the tensile stress in an environment where the circuit board is cooled to a low temperature from the laminating temperature, and by doing so, it is possible to prevent the occurrence of delamination and cracking and to greatly increase the lifespan of the circuit board. As a result, by stabilizing the bonding strength between the mounted elements and the circuit board and preventing the occurrence of delamination and cracking, it is possible to improve the reliability of electronic apparatuses.

Note that the present invention is not limited to a circuit board for flip-chip mounting a semiconductor chip.

What is claimed is:
1. A circuit board comprising:
a core layer; and
a wiring layer being laminated on the core layer,
wherein the core layer is composed of a resin composite including a carbon fiber material, and
wherein the wiring layer has smaller external dimensions in a planar direction than the core layer, and an outer edge portion of the wiring layer and an outer edge portion of the core layer are separated by at least 1 mm in the planar direction.

2. A circuit board according to claim 1,
wherein a thermal expansion coefficient in the planar direction of the circuit board in a laminated state is no greater than 15 ppm/° C.

3. A circuit board according to claim 1, further comprising:
a second wiring layer,
the wiring layer is laminated on a front surface of the core layer, and
the second wiring layer is laminated on a rear surface of the core layer.

4. A circuit board according to claim 2, further comprising:
a second wiring layer,
the wiring layer is laminated on a front surface of the core layer, and
the second wiring layer is laminated on a rear surface of the core layer.

* * * * *